(12) United States Patent
Huemoeller

(10) Patent No.: US 6,372,540 B1
(45) Date of Patent: Apr. 16, 2002

(54) MOISTURE-RESISTANT INTEGRATED CIRCUIT CHIP PACKAGE AND METHOD

(75) Inventor: Ronald P. Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/561,180

(22) Filed: Apr. 27, 2000

(51) Int. Cl.⁷ .............................................. H01L 20/44
(52) U.S. Cl. ...................... 438/106; 438/238; 438/257; 361/700; 361/710; 361/749; 257/698; 257/700; 257/738
(58) Field of Search ................................ 438/106, 238, 438/257; 257/698, 738, 700; 361/749, 700, 716

(56) References Cited

U.S. PATENT DOCUMENTS

| | | | |
|---|---|---|---|
| 5,355,283 A | 10/1994 | Marrs et al. ................. 361/760 |
| 5,386,342 A | * 1/1995 | Rostoker ..................... 361/749 |
| 5,397,917 A | 3/1995 | Ommen et al. ............. 257/698 |
| 5,450,283 A | 9/1995 | Lin et al. ..................... 361/704 |
| 5,640,047 A | 6/1997 | Nakashima ................. 257/738 |
| 5,650,593 A | * 7/1997 | McMillan et al. ......... 174/52.4 |
| 5,929,522 A | * 7/1999 | Weber ......................... 257/738 |
| 5,962,917 A | 10/1999 | Moriyama ................... 257/697 |
| 6,034,427 A | * 3/2000 | Lan et al. .................... 257/698 |
| 6,249,053 B1 | 6/2001 | Nakata et al. .............. 257/738 |

* cited by examiner

Primary Examiner—Richard Elms
Assistant Examiner—Pho M. Luu
(74) Attorney, Agent, or Firm—Skjerven Morrill MacPherson LLP

(57) ABSTRACT

A novel, moisture-resistant integrated circuit chip package is disclosed. In one embodiment, the integrated circuit chip package includes a rigid substrate having a chip side and a backside. A first conductive layer is formed on the chip side of the substrate, and has a pattern forming conductive traces. A first soldermask layer is formed on the chip side of the substrate. The first soldermask layer directly contacts the first conductive layer. The first soldermask layer has at least one opening formed therein. A first contact layer is formed over the first conductive layer in the opening of the first soldermask layer. A second conductive layer is formed on the backside of the substrate. A second soldermask layer is formed on the back side of the substrate and has at least one opening formed therein. A second contact layer overlies the second conductive layer in the opening of the second soldermask layer. The soldermask layer on the chip side of the substrate has high adhesion to the conductive layer, resulting in a high level of moisture resistance for the package.

23 Claims, 4 Drawing Sheets

MOISTURE-RESISTANT INTEGRATED CIRCUIT CHIP PACKAGE AND METHOD

TECHNICAL FIELD OF THE INVENTION

The present invention relates to integrated circuit chip packages, and in particular to a moisture-resistant integrated circuit chip package and method.

BACKGROUND OF THE INVENTION

In some ball grid array (BGA) packages, a substrate is provided with vias. A conductor such as copper is patterned on both sides of the substrate and fills the vias. The copper in the vias provides an electrical connection between conductive areas on the top side ("chip side") of the substrate and conductive areas on the bottom side ("backside") of the substrate. A plating material such as nickel-gold is typically used as the etch mask when the copper is patterned. This means that nickel-gold plate is present not only in the bond pad and solder pad areas of the copper, but also wherever a trace is present on either side of the substrate. A soldermask is formed to cover both sides of the substrate while leaving bond pad and solder pad areas uncovered. This means that the soldermask material covers the nickelgold plating over the conductive traces. Conventional soldermask material does not adhere well to nickel-gold. This lack of adhesion results in poor moisture resistance. For example, JEDEC Level 2 Moisture Resistance Testing exposes a package to 60% relative humidity at 85° C. for 192 hours. BGA packages manufactured using the above-described conventional process cannot meet this level of moisture resistance testing.

SUMMARY OF THE INVENTION

Therefore, a need has arisen for an integrated circuit chip package that addresses the disadvantages and deficiencies of the prior art. In particular, a need has arisen for an integrated circuit chip package with high moisture resistance.

Accordingly, an integrated circuit chip package is disclosed. In one embodiment, the integrated circuit chip package includes a rigid substrate having a chip side and a backside. A first conductive layer is formed on the chip side of the substrate, and has a pattern forming conductive traces. A first soldermask layer is formed on the chip side of the substrate. The first soldermask layer directly contacts the first conductive layer. The first soldermask layer has at least one opening formed therein. A first contact layer is formed over the first conductive layer in the opening of the first soldermask layer. A second conductive layer is formed on the backside of the substrate. A second soldermask layer is formed on the backside of the substrate and has at least one opening formed therein. A second contact layer overlies the second conductive layer in the opening of the second soldermask layer.

In another aspect of the present invention, a method for fabricating an integrated circuit chip package is disclosed. In one embodiment, the method includes forming a first conductive layer on a first side of a rigid substrate, forming a second conductive layer on a second side of the substrate, forming an electrical connection between the first and second conductive layers, selectively etching the first conductive layer to form a first pattern on the first side of the substrate, forming a soldermask layer over selected portions of the first side of the substrate, electroplating a first contact layer on at least one portion of the first conductive layer exposed by the soldermask layer to form at least one contact area, and electroplating a second contact layer on the second conductive layer.

An advantage of the present invention is that the soldermask layer on the chip side of the substrate has high adhesion to the conductive layer. This results in a higher level of moisture resistance for the package.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 13 of the drawings. Like numerals are used for like and corresponding parts of the various drawings.

FIGS. 1 through 12 show cross sections of a portion of an integrated circuit package at various stages of fabrication. As described below, the resulting integrated circuit package 10, shown in FIG. 13, has a high level of moisture resistance.

Figure 1:
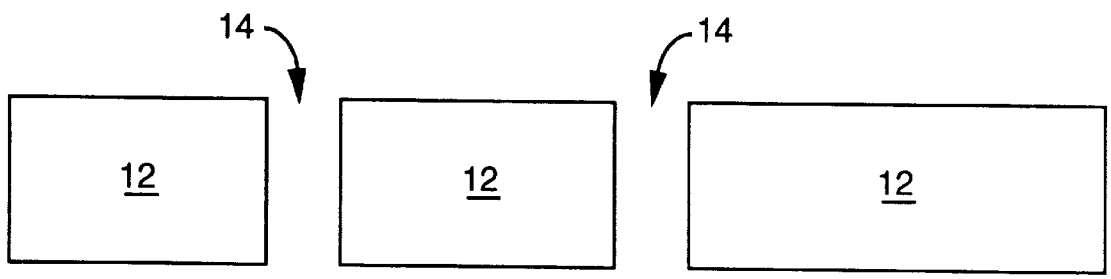
FIGS. 1 through 12 are cross sections of an integrated circuit package at various stages of fabrication.

Referring to FIG. 1, a substrate 12 has vias 14 formed therein. Substrate 12 may be a rigid substrate made from, for example, bizmaleimide triazine (BT) resin or flame-retardant compound FR4 with a thickness of 200 microns. Vias 14 may be formed by mechanical drilling of substrate 12. Vias 14 may, for example, have a diameter of approximately 250 microns.

Figure 2:
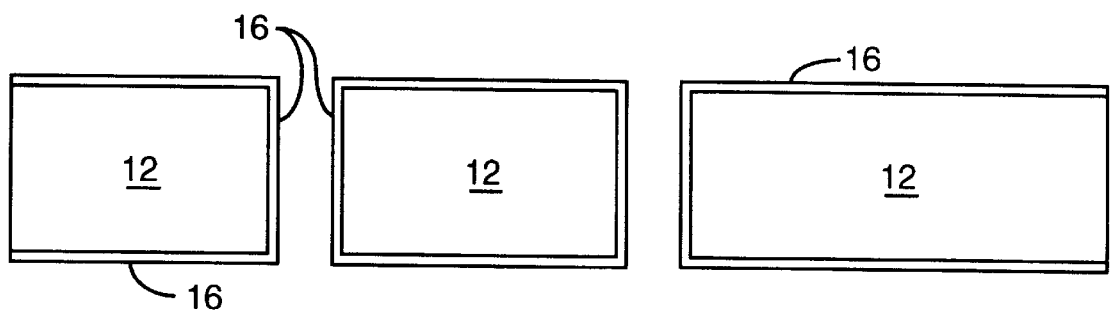

Referring to FIG. 2, a layer of copper 16 is formed on the surface of substrate 12, covering the top and bottom sides of substrate 12 and the inside surfaces of vias 14. Layer 16 may be a seed layer of copper with a thickness of approximately 40 microinches (one micron) formed on substrate 12 by known electroless plating techniques.

Figure 3:
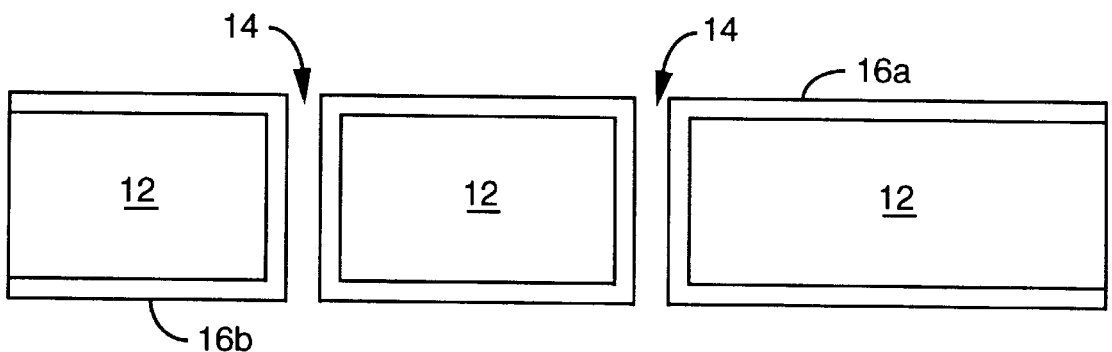

Referring to FIG. 3, the thickness of layer 16 is increased to approximately 15 microns or more by electroplating. In the description that follows, layer 16 will be considered to comprise a layer 16a residing on the chip side of substrate 12 and a layer 16b residing on the backside of substrate 12.

Figure 4:
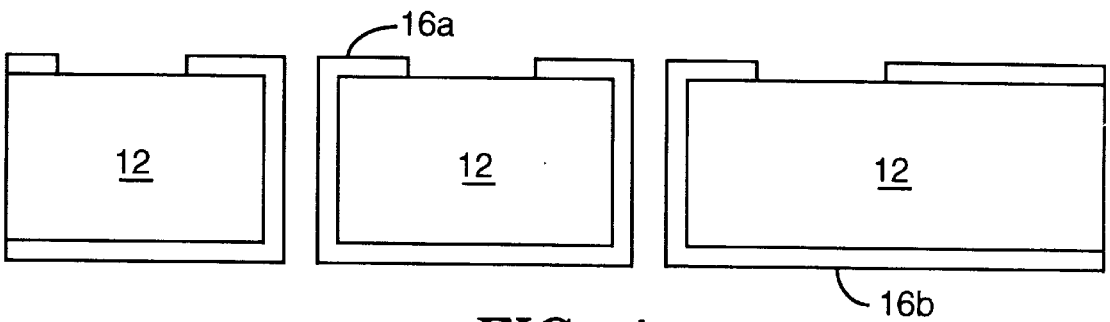

Referring to FIG. 4, layer 16a is patterned on the top side (chip side) of substrate 12. This patterning may be performed using a conventional dry film photoresist (not shown) with a thickness of, for example, 30 microns. After the photoresist is developed, layer 16a may be etched with, for example, cupric chloride, after which the photoresist may be removed.

Figure 5:
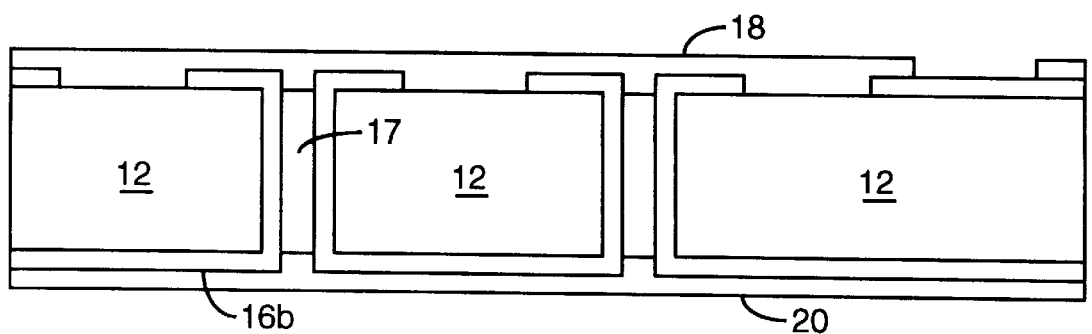

Referring to FIG. 5, vias 14 are filled with an intervening layer 17, and a soldermask layer 18 is deposited on the chip side of substrate 12. Soldermask layer 18 may be formed using a liquid soldermask such as AUS5 soldermask available from Taiyo Ink Mfg. Co., Ltd., in Tokyo, Japan. Soldermask layer 18 is then patterned using conventional techniques to expose wirebond pad areas of layer 16a to be plated with a contact metal. On the bottom side (backside) of substrate 12, a photoresist layer 20 is formed over copper layer 16b to protect this part of layer 16b from contact metal electroplating. Photoresist layer 20 may be a dry film photoresist such as that described above.

Figure 6:
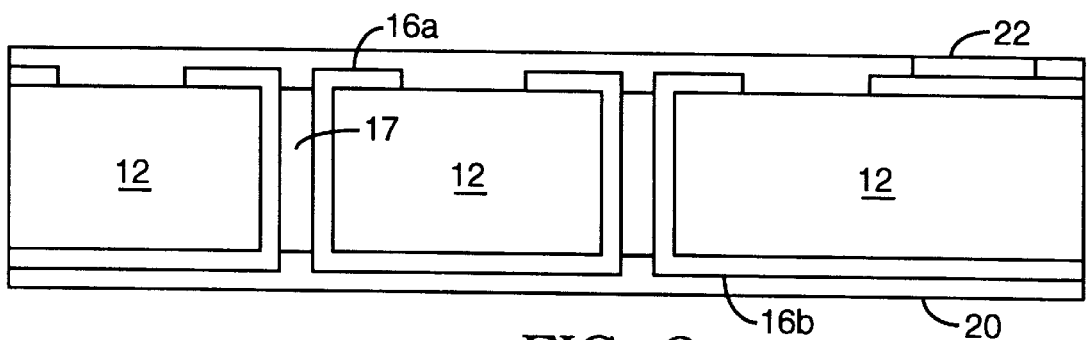

Referring to FIG. 6, a contact layer 22 is plated on the exposed areas of copper layer 16a. Layer 22 may be formed by electroplating between five and 12 microns of nickel, followed by plating between one-half and one micron of gold. Copper layer 16b on the backside of substrate 12 may provide electrical contact to copper layer 16a on the chip side of substrate 12 through vias 14 during this electroplating process, thereby eliminating the need for bussing tails which consume valuable package "real estate".

Figure 7:
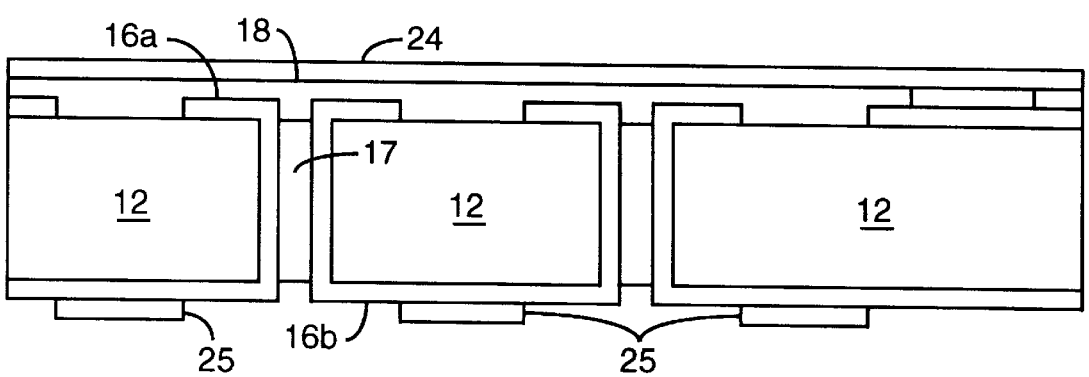

Referring to FIG. 7, photoresist layer 20 is removed from the backside of substrate 12 and a photoresist layer 24 is formed on the chip side of substrate 12. A photoresist layer 25 is formed and patterned on the backside of substrate 12. Photoresist layers 24 and 25 may be formed in the same manner as photoresist layer 20. Photoresist layer 24 serves to protect copper layer 16a from contact metal plating. Photoresist layer 25 acts as a deposition mask for contact plating on copper layer 16b.

Figure 8:
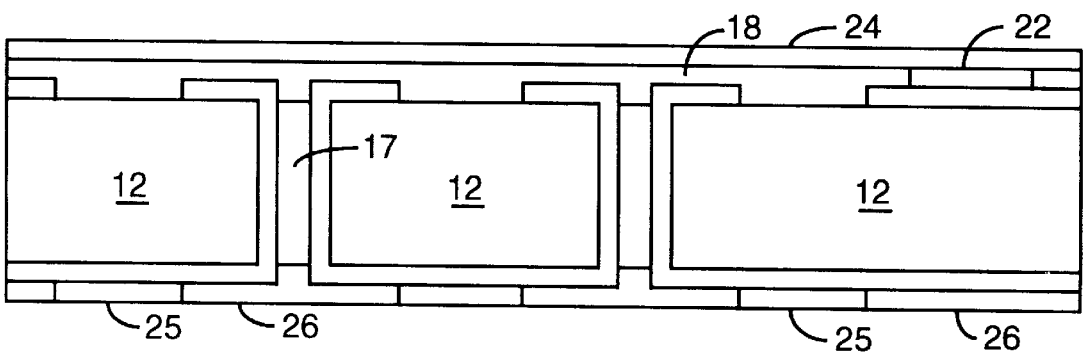

Referring to FIG. 8, a contact layer 26 is formed on the backside of substrate 12. Contact layer 26 may be formed by electroplating of nickel and gold as previously described in connection with layer 22. As will be described below, contact layer 26 serves not only as a contact layer, but also as an etch resist for copper layer 16b on the backside of substrate 12.

Figure 9:
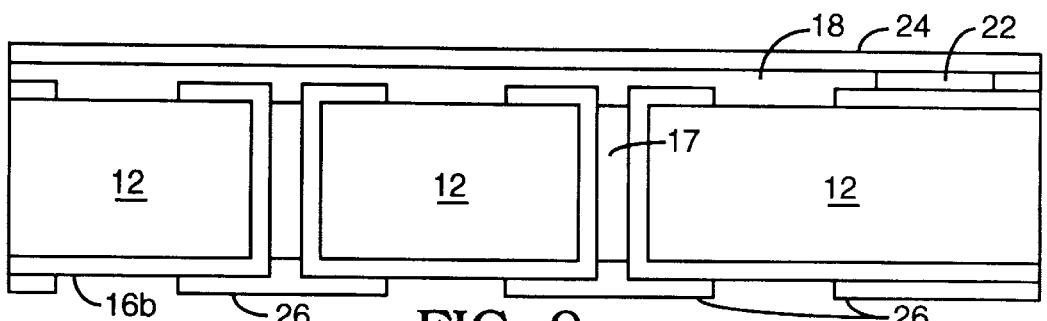
Figure 10:
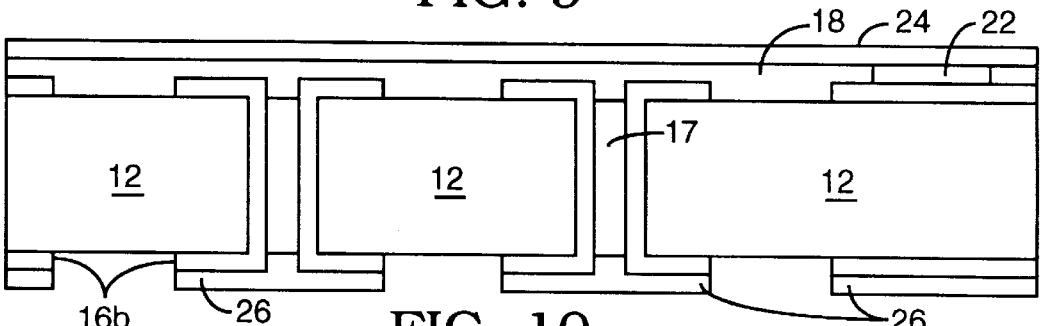

Referring to FIG. 9, photoresist layer 25 is removed from the backside of substrate 12. Referring to FIG. 10, copper layer 16b is removed in the areas exposed by contact layer 26. Copper layer 16b may be etched away in these exposed areas using, for example, cupric chloride.

Figure 11:
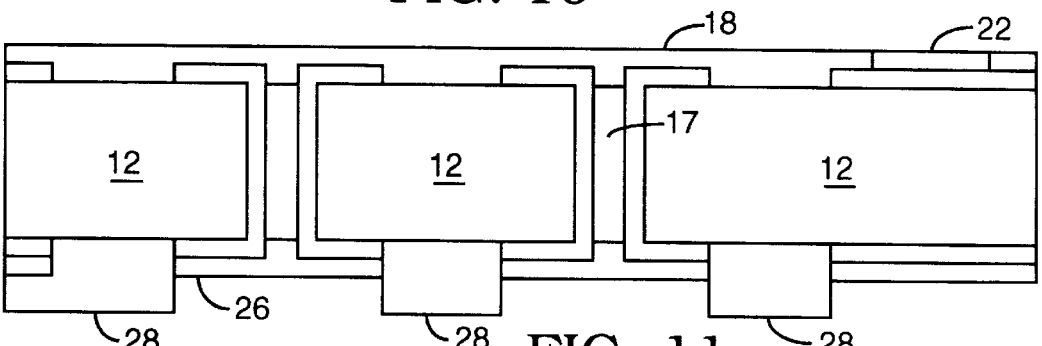

Referring to FIG. 11, photoresist layer 24 is removed from the chip side of substrate 12 and a layer of soldermask 28 is formed and patterned on the backside of substrate 12. Soldermask layer 28 may be formed using, for example, a liquid soldermask such as the aforementioned AUS5 soldermask. Soldermask layer 28 is then patterned using conventional techniques to expose solder pad areas of contact layer 26.

Figure 12:
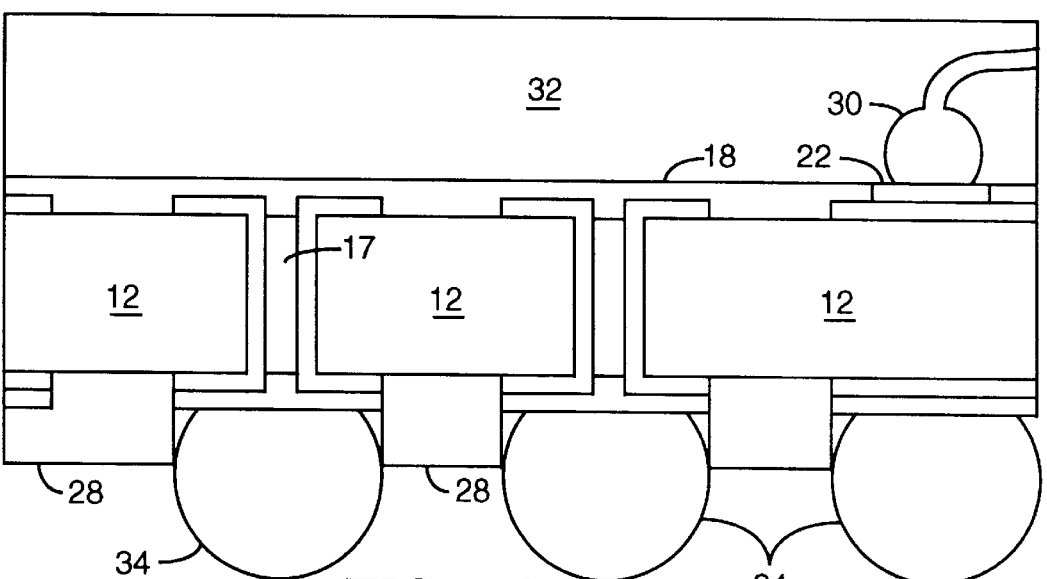
Figure 13:
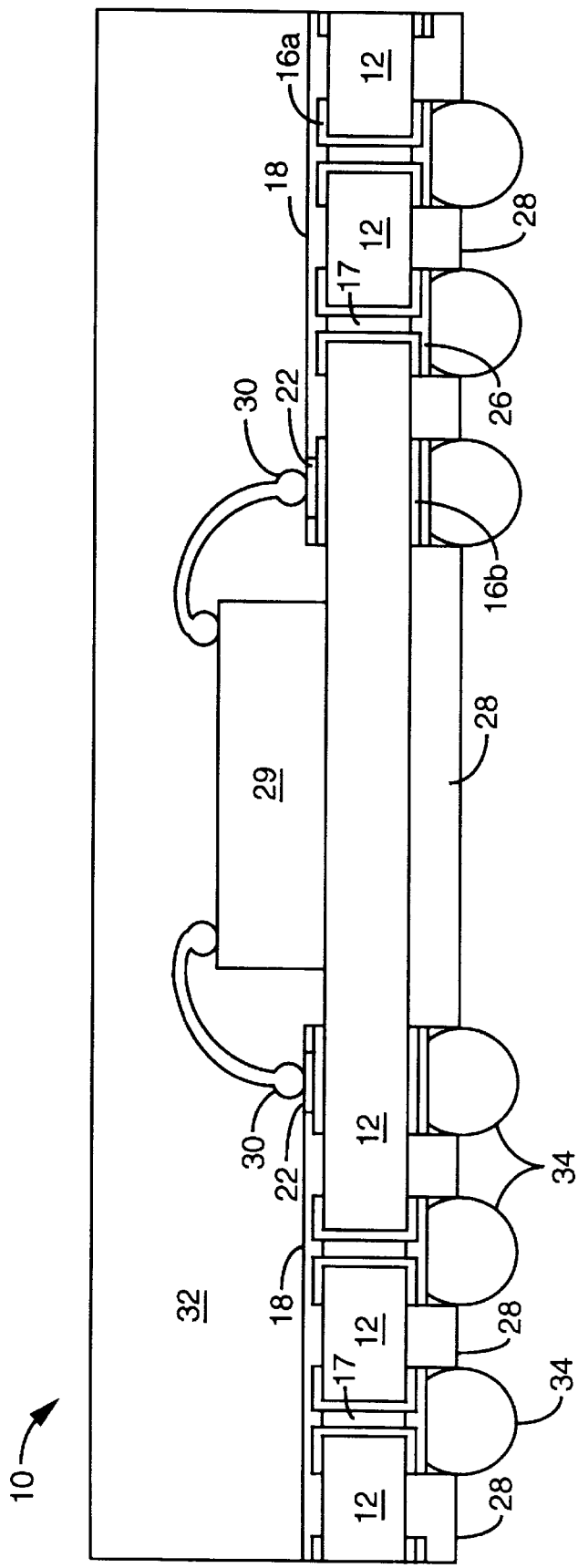
FIG. 13 is a cross section of an integrated circuit package in accordance with an embodiment of the present invention.

Substrate 12 is now ready to receive a semiconductor die and solder balls for attachment to a printed circuit board. Referring to FIG. 12 and FIG. 13, a semiconductor die 29 is attached to the chip side of substrate 12. Wirebonds 30 are formed between the die and the wirebond pads of layer 22. A mold compound 32 may then be injection-molded around the die and wirebonds 30. Solder balls 34, which may be eutectic solder balls of conventional composition and design, are attached to the solder pad areas of contact layer 26 using conventional techniques. Package 10 may then be attached to a printed circuit board by reflowing solder balls 34 using conventional techniques.

It will be appreciated from the foregoing description that the patterning of copper layer 16a is different from that of copper layer 16b. In particular, the patterning of copper layer 16a does not follow the conventional technique in which a Ni/Au contact layer (such as layer 22 or layer 26) is used as an etch mask for the copper layer. Instead, a photoresist is used to pattern copper layer 16a. Soldermask layer 18 then acts as a mask for the wirebond pad plating of copper layer 16a. As a result, soldermask layer 18 does not overlie any portion of contact layer 22. Thus, any concern about the adhesion (or lack of adhesion) of soldermask layer 18 to the Ni/Au plating of contact layer 22 is obviated by this design. Since soldermask layer 18 plays a crucial role in determining the moisture resistance of package 10, the high level of adhesion between soldermask layer 18 and substrate 12 and copper layer 16a results in high moisture resistance.

Although the present invention and its advantages have been described in detail, it should be understood that various changes, substitutions, and alterations can be made therein without departing from the spirit and scope of the invention as defined by the appended claims.

I claim:

1. An integrated circuit chip package comprising:
   a substrate;
   a first conductive layer formed on the substrate, the first conductive layer having a pattern forming conductive traces;
   a first soldermask layer directly contacting the first conductive layer, the first soldermask layer having at least one opening formed therein; and
   a first contact layer formed over the first conductive layer in the at least one opening of the first soldermask layer.

2. The integrated circuit chip package of claim 1, further comprising a semiconductor die attached to the substrate.

3. The integrated circuit chip package of claim 2, further comprising a bond wire attached between a contact area of the first contact layer and the semiconductor die.

4. The integrated circuit chip package of claim 3, further comprising an encapsulant encapsulating the semiconductor die and the bond wire.

5. The integrated circuit chip package of claim 4, wherein said encapsulant overlies the first soldermask layer and the first contact layer.

6. The integrated circuit chip package of claim 5, wherein said encapsulant is molded over the semiconductor die, the bond wire, the first soldermask layer, and the first contact layer.

7. The integrated circuit chip package of claim 1, wherein the first conductive layer comprises copper.

8. The integrated circuit chip package of claim 1, wherein the first contact layer comprises Ni/Au.

9. The integrated circuit chip package of claim 1, further comprising
   a semiconductor die electrically connected to the first contact layer in the at least one opening of the first soldermask layer; and
   a molded encapsulant overlying the first soldermask layer, the first contact layer in the at least one opening of the first soldermask layer, and at least a portion of the semiconductor die.

10. The integrated circuit chip package of claim 9, wherein the die is electrically connected to the first contact layer by a bond wire.

11. An integrated circuit package comprising:
    a substrate including a first side;
    a first conductive layer on the first side of the substrate, the first conductive layer including a pattern forming conductive traces;
    a first soldermask layer directly contacting the first conductive layer along horizontal surfaces, the first soldermask layer including a plurality of openings formed therein;
    a first contact layer formed over the first conductive layer in each of the plurality of openings of the first soldermask layer;
    a semiconductor die electrically coupled to the first contact layer; and
    an encapsulant encapsulating the first contact layer, the plurality of openings in the first soldermask layer, and at least a portion of the semiconductor die.

12. The integrated circuit package of claim 11, further comprising a bond wire coupled between a contact area of the first contact layer and the semiconductor die.

13. The integrated circuit package of claim 11, wherein the semiconductor die is mounted on the first side of the substrate.

14. The integrated circuit package of claim 11, wherein the first conductive layer comprises copper.

15. The integrated circuit package of claim 11, wherein the first contact layer comprises nickel and gold.

16. An integrated circuit package comprising:

a substrate;

a first conductive layer on the substrate, the first conductive layer including a pattern of conductive traces;

a first soldermask layer directly contacting the first conductive layer along horizontal surfaces, the first soldermask layer including a plurality of openings therein; and a first contact layer contacting the first conductive layer through the openings of the first soldermask layer, wherein the first soldermask layer does not overlie the first contact layer.

17. The integrated circuit package of claim 16, further comprising a semiconductor die electrically connected to the frist contact layer; and a molded encapsulant overlying the first soldermask layer, the first contact layer, and at least a portion of the semiconductor die.

18. The integrated circuit package of claim 16, further comprising a semiconductor die attached to the substrate.

19. The integrated circuit package of claim 18, further comprising a bond wire attached between a contact area of the first contact layer and the semiconductor die.

20. The integrated circuit package of claim 19, further comprising an encapsulant encapsulating the semiconductor die and the bond wire.

21. The integrated circuit chip package of claim 20, wherein said encapsulant overlies the first contact layer and at least a portion of the first soldermask layer.

22. The integrated circuit package of claim 16, wherein the first conductive layer comprises copper.

23. The integrated circuit package of claim 16, wherein the first contact layer comprises nickel and gold.

* * * * *

UNITED STATES PATENT AND TRADEMARK OFFICE
CERTIFICATE OF CORRECTION

PATENT NO. : 6,372,540 B1
DATED : April 16, 2002
INVENTOR(S) : Ronald P. Huemoeller It is certified that error appears in the above-identified patent and that said Letters Patent is hereby corrected as shown below:

Column 6,
Line 1, delete "frist" insert -- first --.

Signed and Sealed this

Eighteenth Day of February, 2003

JAMES E. ROGAN
*Director of the United States Patent and Trademark Office*